(12) United States Patent
Maruyama (10) Patent No.: US 10,608,546 B2
(45) Date of Patent: Mar. 31, 2020

(54) POWER CONVERTER

(71) Applicant: FUJI ELECTRIC CO., LTD., Kanagawa (JP)

(72) Inventor: Koji Maruyama, Tokyo (JP)

(73) Assignee: FUJI ELECTRIC CO., LTD. (JP)

( * ) Notice: Subject to any disclaimer, the term of this patent is extended or adjusted under 35 U.S.C. 154(b) by 157 days.

(21) Appl. No.: 15/658,467

(22) Filed: Jul. 25, 2017

(65) Prior Publication Data

US 2018/0062533 A1 Mar. 1, 2018

(30) Foreign Application Priority Data

Sep. 1, 2016 (JP) .................................. 2016-171288

(51) Int. Cl.
*H02M 7/00* (2006.01)
*H02M 1/088* (2006.01)
(Continued)

(52) U.S. Cl.
CPC ........... *H02M 7/003* (2013.01); *H02M 1/088* (2013.01); *H02M 7/537* (2013.01); *H05K 1/025* (2013.01);
(Continued)

(58) Field of Classification Search
CPC ...... H02M 7/003; H02M 7/537; H02M 1/088; H02M 7/5387; H05K 1/0216; H05K 2201/09245; H05K 1/0231; H05K 1/025; H05K 2201/09254; H05K 2201/09672; H05K 2201/10015; H05K 1/0265; H01L 2924/00; H01L 2924/00014;
(Continued)

(56) References Cited

U.S. PATENT DOCUMENTS

| 8,629,443 B2* | 1/2014 | Ogasawara | ......... G02F 1/13452 |
| | | | 257/59 |
| 9,660,356 B1* | 5/2017 | Nakamura | ............... H01R 4/30 |

(Continued)

FOREIGN PATENT DOCUMENTS

JP 2010-252490 A 11/2010

*Primary Examiner* — Nguyen Tran
*Assistant Examiner* — Demetries A Gibson
(74) *Attorney, Agent, or Firm* — Ostrolenk Faber LLP (57) ABSTRACT

A power converter in which a plurality of semiconductor switches are connected to a drive circuit configured to control states of the semiconductor switches, the power converter including: a plurality of semiconductor switches having the same reference potential; a drive circuit configured to control states of the plurality of semiconductor switches; and a multilayer substrate in which a wiring that connects the drive circuit and the plurality of semiconductor switches and includes a reference potential wiring and a control signal wiring is disposed, wherein, in the multilayer substrate, the reference potential wiring and the control signal wiring are disposed in different layers at positions overlapping in a substrate lamination direction, and within the wiring, in a common wiring portion from the drive circuit to a branch point of the wiring and a branch wiring portion from the branch point to each of the semiconductor switches, an impedance of the common wiring portion is set to be lower than an impedance of the branch wiring portion and wiring impedances of the branch wiring portions are matched to each other.

4 Claims, 9 Drawing Sheets

(51) Int. Cl.
   *H05K 1/02*       (2006.01)
   *H02M 7/537*      (2006.01)
   *H02M 7/5387*     (2007.01)
(52) U.S. Cl.
   CPC ......... *H05K 1/0216* (2013.01); *H02M 7/5387* (2013.01); *H05K 1/0231* (2013.01); *H05K 1/0265* (2013.01); *H05K 2201/09245* (2013.01); *H05K 2201/09254* (2013.01); *H05K 2201/09672* (2013.01); *H05K 2201/10015* (2013.01)
(58) Field of Classification Search
   CPC . H01L 2224/48247; H01L 2224/48472; H01L 2224/49171; H01L 2924/13055; H01L 2924/13091; H01L 2924/3011; H01L 2224/45124; H01L 2224/45147; H01L 2924/12032; H01L 2924/1305; H01L 2924/1306; H01L 2924/13; H01L 2924/13062; H01L 2924/13
   See application file for complete search history.

(56) References Cited

U.S. PATENT DOCUMENTS

| | | | |
|---|---|---|---|
| 2003/0002311 A1* | 1/2003 | Mori ................... | H02M 7/003 |
| | | | 363/147 |
| 2003/0080436 A1* | 5/2003 | Ishikawa ........... | G02F 1/136227 |
| | | | 257/776 |
| 2005/0035816 A1* | 2/2005 | Sparling ............... | H02M 7/003 |
| | | | 327/565 |
| 2007/0188119 A1* | 8/2007 | Sonoda ................ | H02K 11/048 |
| | | | 318/400.21 |
| 2010/0097093 A1* | 4/2010 | Ricard .................. | G05F 1/567 |
| | | | 326/30 |
| 2010/0127652 A1* | 5/2010 | Morita ................ | H01L 29/7787 |
| | | | 318/400.27 |
| 2011/0215746 A1* | 9/2011 | Ikoshi .................... | H01L 24/06 |
| | | | 318/400.27 |
| 2012/0099357 A1* | 4/2012 | Morita ................ | H01L 27/0617 |
| | | | 363/131 |
| 2016/0344279 A1* | 11/2016 | Kanda .................... | H02M 1/34 |
| 2016/0344301 A1* | 11/2016 | Maruyama .............. | H02M 7/48 |

* cited by examiner

POWER CONVERTER

BACKGROUND OF THE INVENTION

Field of the Invention

An embodiment of the present invention relates to a power converter.

Priority is claimed on Japanese Patent Application No. 2016-171288, filed Sep. 1, 2016, the content of which is incorporated herein by reference.

Description of Related Art

In the related art, a technique for saving labor in wiring work using a printed wiring board for a wiring that connects a drive circuit of a semiconductor switch and a semiconductor switch is known in a power converter including a DC to AC conversion circuit or an AC to DC conversion circuit (for example, refer to Japanese Unexamined Patent Application First Publication No. 2010-252490).

When the printed wiring board is used for the wiring that connects a drive circuit of a semiconductor switch and a semiconductor switch, the semiconductor switch may malfunction due to noise caused by a wiring pattern of the printed wiring board such as inductive noise or noise caused by charge and discharge of a parasitic capacitance. However, in the related art described above, the wiring pattern of the printed wiring board for reducing such noise is not disclosed. That is, in the related art described above, there is a problem in that it is not possible to reduce malfunctions of the semiconductor switch due to noise caused by the wiring pattern of the printed wiring board.

SUMMARY OF THE INVENTION

The present invention provides a power converter capable of reducing malfunctions of a semiconductor switch due to noise caused by a wiring pattern of a printed wiring board.

An embodiment of the present invention is a power converter in which a plurality of semiconductor switches are connected to a drive circuit configured to control states of the semiconductor switches, the power converter including: a plurality of semiconductor switches having the same reference potential; a drive circuit configured to control states of the plurality of semiconductor switches; and a multilayer substrate in which a wiring that connects the drive circuit and the plurality of semiconductor switches and includes a reference potential wiring and a control signal wiring is disposed, wherein, in the multilayer substrate, the reference potential wiring and the control signal wiring are disposed in different layers at positions overlapping in a substrate lamination direction, and within the wiring, in a common wiring portion from the drive circuit to a branch point of the wiring and a branch wiring portion from the branch point to each of the semiconductor switches, an impedance of the common wiring portion is set to be lower than an impedance of the branch wiring portion and wiring impedances of the branch wiring portions are matched to each other.

In addition, the power converter according to the embodiment of the present invention further includes a second semiconductor switch whose reference potential is different from a reference potential of the semiconductor switch; and a second drive circuit configured to control a state of the second semiconductor switch, wherein, in the multilayer substrate, a reference potential wiring and a control signal wiring of a second wiring that connects the second drive circuit and the second semiconductor switch are disposed in different layers at positions overlapping in a substrate lamination direction, and wherein a wiring length of a portion in which the wiring and the second wiring overlap in the lamination direction is shorter than a wiring length of a portion in which the reference potential wiring and the control signal wiring of the wiring overlap in the lamination direction, and a wiring length of a portion in which the reference potential wiring and the control signal wiring of the second wiring overlap in the lamination direction.

In addition, in the power converter according to the embodiment of the present invention, in the portion in which the wiring and the second wiring overlap in the substrate lamination direction, a wiring length of one wiring between the wiring and the second wiring is the same as a wiring width of the other wiring.

In addition, in the power converter according to the embodiment of the present invention, a power supply wiring supplying a potential for controlling a state of the semiconductor switch is disposed in the multilayer substrate, and in the common wiring portion, a capacitive element is provided between the reference potential wiring and the power supply wiring or between the control signal wiring and the power supply wiring.

In addition, in the power converter according to the embodiment of the present invention, in a portion in which the reference potential wiring and the control signal wiring overlap in the substrate lamination direction, a wiring shape of the reference potential wiring and a wiring shape of the control signal wiring match when viewed in the lamination direction.

According to the present invention, it is possible to provide a power converter capable of reducing malfunctions of a semiconductor switch due to noise caused by a wiring pattern of a printed wiring board.

DETAILED DESCRIPTION OF THE INVENTION

First Embodiment

A power converter of a first embodiment will be described below with reference to the drawings.

Figure 1:
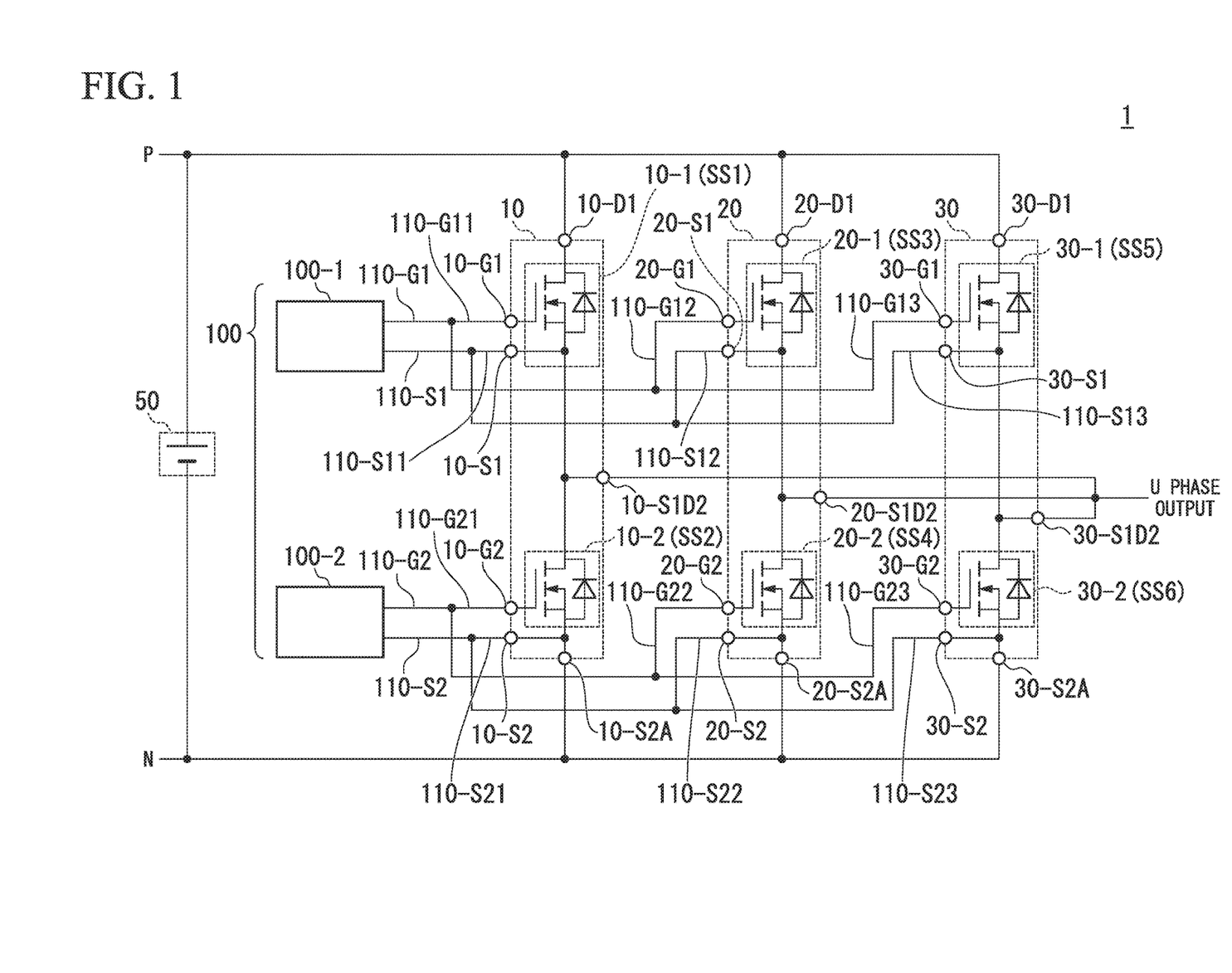
FIG. 1 is a diagram showing an example of a circuit configuration of a power converter of a first embodiment.

FIG. 1 is a diagram showing an example of a circuit configuration of a power converter 1 of the present embodiment. The power converter 1 of the present embodiment includes a so-called 2-level inverter circuit. FIG. 1 shows a circuit configuration of a single phase (for example, a U phase) in a multi-phase 2-level inverter circuit included in the power converter 1. The power converter 1 includes a first module 10, a second module 20, a third module 30, a drive circuit 100, and a DC power supply 50.

The first module 10, the second module 20, and the third module 30 each include two semiconductor switches SS.

Specifically, the first module 10 includes an upper arm semiconductor switch 10-1 and a lower arm semiconductor switch 10-2. The second module 20 includes an upper arm semiconductor switch 20-1 and a lower arm semiconductor switch 20-2. The third module 30 includes an upper arm semiconductor switch 30-1 and a lower arm semiconductor switch 30-2.

These semiconductor switches SS each include an MOS-FET and a diode.

In the following description, the upper arm semiconductor switch 10-1, the upper arm semiconductor switch 20-1, and the upper arm semiconductor switch 30-1 will be referred to simply as an upper arm, and the lower arm semiconductor switch 10-2, the lower arm semiconductor switch 20-2, and the lower arm semiconductor switch 30-2 will be referred to simply as a lower arm.

In addition, the upper arm semiconductor switch 10-1 will be referred to as a first semiconductor switch SS1, and the lower arm semiconductor switch 10-2 will be referred to as a second semiconductor switch SS2. The upper arm semiconductor switch 20-1 will be referred to as a third semiconductor switch SS3 and the lower arm semiconductor switch 20-2 will be referred to as a fourth semiconductor switch SS4. The upper arm semiconductor switch 30-1 will be referred to as a fifth semiconductor switch SS5 and the lower arm semiconductor switch 30-2 will be referred to as a sixth semiconductor switch SS6.

The first module 10, the second module 20, and the third module 30 are connected in parallel to a positive potential P and a negative potential N of the DC power supply 50. A connection point of the upper arm and the lower arm of the first module 10, a connection point of the upper arm and the lower arm of the second module 20, and a connection point of the upper arm and the lower arm of the third module 30 are connected to an AC output (a U phase output).

The drive circuit 100 applies a control signal (a gate signal) to the semiconductor switch SS. The drive circuit 100 includes a first drive circuit 100-1 configured to apply a control signal to the upper arm and a second drive circuit 100-2 configured to apply a control signal to the lower arm.

The first drive circuit 100-1 is connected to the upper arm semiconductor switch 10-1, the upper arm semiconductor switch 20-1, and the upper arm semiconductor switch 30-1 by a control signal wiring and a reference potential wiring. The first drive circuit 100-1 controls a state of the first semiconductor switch SS1 and states of the third semiconductor switch SS3 and the fifth semiconductor switch SS5.

The second drive circuit 100-2 is connected to the lower arm semiconductor switch 10-2, the lower arm semiconductor switch 20-2, and the lower arm semiconductor switch 30-2 by a control signal wiring and a reference potential wiring. The second drive circuit 100-2 controls a state of the second semiconductor switch SS2 and states of the fourth semiconductor switch SS4 and the sixth semiconductor switch SS6.

The control signal wiring and the reference potential wiring include a common wiring portion from the drive circuit 100 to a branch point of the wiring and a branch wiring portion from the branch point to each of the semiconductor switches SS.

Specifically, the control signal wiring that connects the first drive circuit 100-1 and the upper arm includes a control signal common wiring 110-G1, a control signal first branch wiring 110-G11, a control signal second branch wiring 110-G12, and a control signal third branch wiring 110-G13. The control signal common wiring 110-G1 is a common wiring portion from the first drive circuit 100-1 to a branch point of the wiring. The control signal first branch wiring 110-G11 is a branch wiring portion from the branch point to the upper arm semiconductor switch 10-1. The control signal second branch wiring 110-G12 is a branch wiring portion from the branch point to the upper arm semiconductor switch 20-1. The control signal third branch wiring 110-G13 is a branch wiring portion from the branch point to the upper arm semiconductor switch 30-1.

In addition, the reference potential wiring that connects the first drive circuit 100-1 and the upper arm includes a reference potential common wiring 110-S1, a reference potential first branch wiring 110-S11, a reference potential second branch wiring 110-S12, and a reference potential third branch wiring 110-S13. The reference potential common wiring 110-S1 is a common wiring portion from the first drive circuit 100-1 to a branch point of the wiring.

The reference potential first branch wiring 110-S11 is a branch wiring portion from the branch point to the upper arm semiconductor switch 10-1. The reference potential second branch wiring 110-S12 is a branch wiring portion from the branch point to the upper arm semiconductor switch 20-1. The reference potential third branch wiring 110-S13 is a branch wiring portion from the branch point to the upper arm semiconductor switch 30-1.

In addition, the control signal wiring that connects the second drive circuit 100-2 and the lower arm includes a control signal common wiring 110-G2, a control signal first branch wiring 110-G21, a control signal second branch wiring 110-G22, and a control signal third branch wiring 110-G23. The control signal common wiring 110-G2 is a common wiring portion from the second drive circuit 100-2 to a branch point of the wiring. The control signal first branch wiring 110-G21 is a branch wiring portion from the branch point to the lower arm semiconductor switch 10-2. The control signal second branch wiring 110-G22 is a branch wiring portion from the branch point to the lower arm semiconductor switch 20-2. The control signal third branch wiring 110-G23 is a branch wiring portion from the branch point to the lower arm semiconductor switch 30-2.

In addition, the reference potential wiring that connects the second drive circuit 100-2 and the lower arm includes a reference potential common wiring 110-S2, a reference potential first branch wiring 110-S21, a reference potential second branch wiring 110-S22, and a reference potential third branch wiring 110-S23. The reference potential common wiring 110-S2 is a common wiring portion from the second drive circuit 100-2 to a branch point of the wiring.

The reference potential first branch wiring 110-S21 is a branch wiring portion from the branch point to the lower arm semiconductor switch 10-2. The reference potential second branch wiring 110-S22 is a branch wiring portion from the branch point to the lower arm semiconductor switch 20-2. The reference potential third branch wiring 110-S23 is a branch wiring portion from the branch point to the lower arm semiconductor switch 30-2.

In the following description, a wiring that connects the first drive circuit 100-1 to the first semiconductor switch SS1, the third semiconductor switch SS3 and the fifth semiconductor switch SS5 will be referred to as a first wiring PW1. The first wiring PW1 includes the reference potential common wiring 110-S1 and the control signal common wiring 110-G1. In addition, a wiring that connects the second drive circuit 100-2 to the second semiconductor switch SS2, the fourth semiconductor switch SS4 and the sixth semiconductor switch SS6 will be referred to as a second wiring PW2. The second wiring PW2 includes the reference potential common wiring 110-S2 and the control signal common wiring 110-G2.

According to the above-described configuration, the power converter 1 applies a control signal (a gate signal) to the plurality of semiconductor switches SS connected in parallel from the drive circuit 100 and operates the plurality of semiconductor switches SS in parallel.

Next, a circuit connection of the first module 10 will be described with reference to FIG. 2. Since a circuit connection of the second module 20 and a circuit connection of the third module 30 match the circuit connection of the first module 10, descriptions thereof will be omitted.

Figure 2:
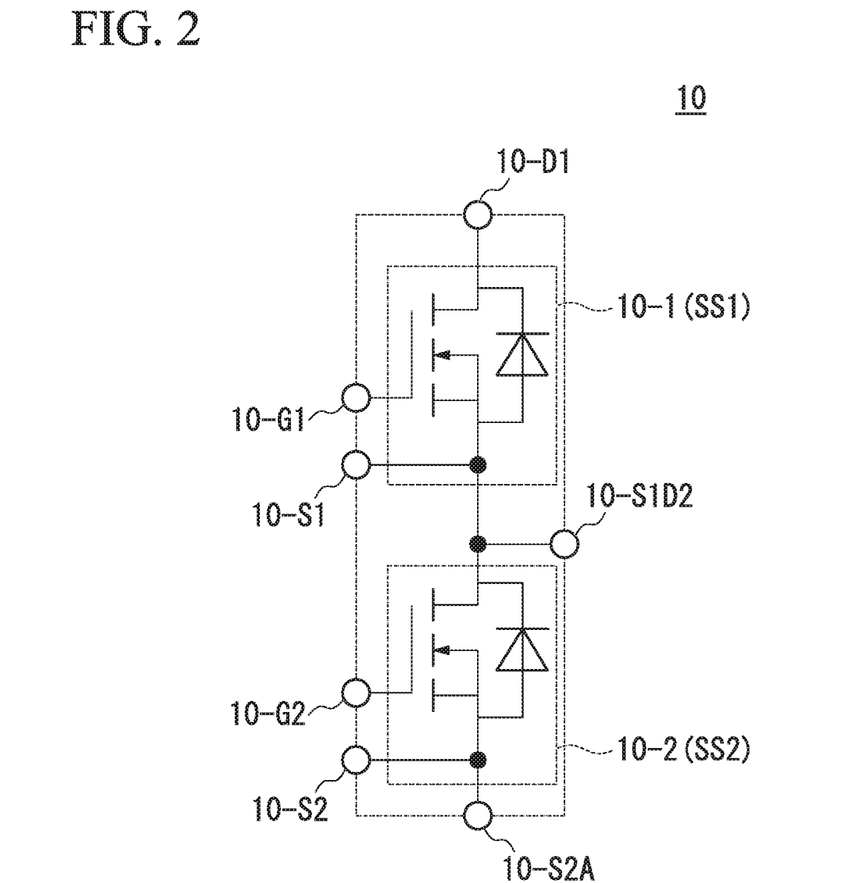
FIG. 2 is a diagram showing an example of a circuit connection of a semiconductor switch module of the present embodiment.

FIG. 2 is a diagram showing an example of a circuit connection of a semiconductor switch module of the present embodiment.

The first module 10 includes a high potential connection terminal 10-D1, a low potential connection terminal 10-S2A, a first AC output terminal 10-S1D2, a first gate connection terminal 10-G1, a second gate connection terminal 10-G2, a first auxiliary source connection terminal 10-S1, and a second auxiliary source connection terminal 10-S2.

The high potential connection terminal 10-D1 is connected to the positive potential P of the DC power supply 50. The low potential connection terminal 10-S2A is connected to the negative potential N of the DC power supply 50. The first AC output terminal 10-S1D2 is connected to a second AC output terminal 20-S1D2 of the second module 20 and a third AC output terminal 30-S1D2 of the third module 30 and outputs an alternating current.

A control signal (a gate signal) is supplied to the first gate connection terminal 10-G1 from the first drive circuit 100-1 through the control signal common wiring 110-G1. A reference potential is supplied to the first auxiliary source connection terminal 10-S1 from the first drive circuit 100-1 through the reference potential common wiring 110-S1.

A control signal (a gate signal) is supplied to the second gate connection terminal 10-G2 from the second drive circuit 100-2 through the control signal common wiring 110-G2. A reference potential is supplied to the second auxiliary source connection terminal 10-S2 from the second drive circuit 100-2 through the reference potential common wiring 110-S2.

As described above, a reference potential is supplied to the first auxiliary source connection terminal 10-S1 of the first module 10 from the first drive circuit 100-1. A reference potential is supplied from the second drive circuit 100-2 to the second auxiliary source connection terminal 10-S2 of the first module 10. The reference potential supplied to the first auxiliary source connection terminal 10-S1 and the reference potential supplied to the second auxiliary source connection terminal 10-S2 are different.

In the second module 20 connected in parallel to the first module 10, similarly to the first module 10, a reference potential is supplied to a first auxiliary source connection terminal 20-S1 from the first drive circuit 100-1. In addition, a reference potential is supplied to a second auxiliary source connection terminal 20-S2 of the second module 20 from the second drive circuit 100-2. The reference potential supplied to the first auxiliary source connection terminal 20-S1 and the reference potential supplied to the second auxiliary source connection terminal 20-S2 are different.

In addition, in the third module 30 connected in parallel to the first module 10 and the second module 20, similarly to the first module 10, a reference potential is supplied to a first auxiliary source connection terminal 30-S1 from the first drive circuit 100-1. In addition, a reference potential is supplied to a second auxiliary source connection terminal 30-S2 of the third module 30 from the second drive circuit 100-2.

The reference potential supplied to the first auxiliary source connection terminal 30-S1 and the reference potential supplied to the second auxiliary source connection terminal 30-S2 are different.

That is, the upper arm semiconductor switches SS1, SS3, and SS5 and the lower arm semiconductor switches SS2, SS4, and SS6 have different reference potentials.

In other words, the reference potential of the second semiconductor switch SS2 and the reference potential of the first semiconductor switch SS1 are different. That is, the power converter 1 includes the second semiconductor switch SS2 whose reference potential is different from the reference potential of the first semiconductor switch SS1.

In addition, the reference potential of the third semiconductor switch SS3 and the reference potential of the fifth semiconductor switch SS5 are the same as the reference potential of the first semiconductor switch SS1. That is, the power converter 1 includes the third semiconductor switch SS3 and the fifth semiconductor switch SS5 whose reference potentials are the same as the reference potential of the first semiconductor switch SS1.

In addition, the reference potential of the fourth semiconductor switch SS4 is the same as the reference potential of the second semiconductor switch SS2 and the reference potential of the sixth semiconductor switch SS6. That is, the power converter 1 includes the fourth semiconductor switch SS4 and the sixth semiconductor switch SS6 whose reference potentials are the same as the reference potential of the second semiconductor switch SS2.

Figure 3:
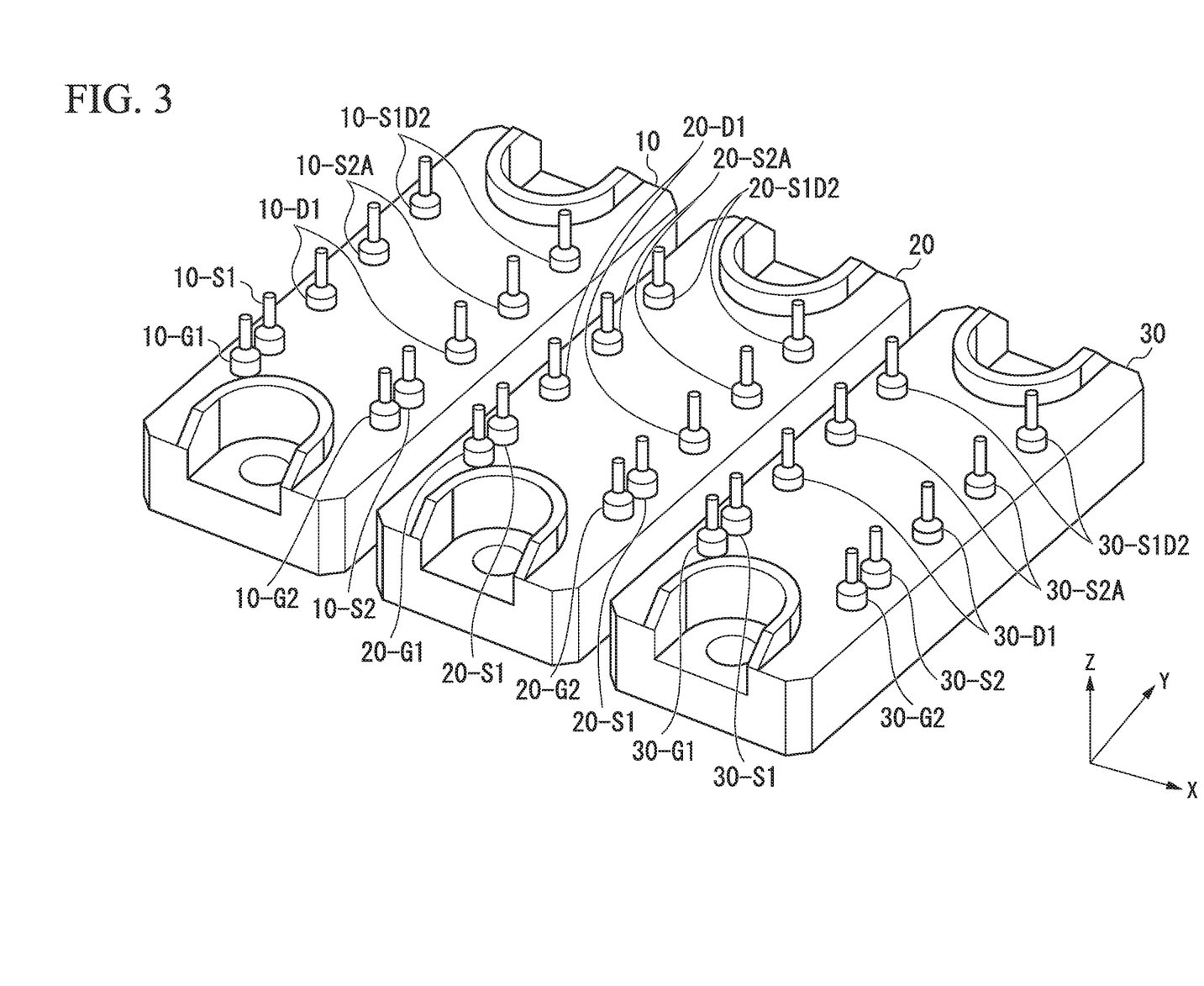
FIG. 3 is a diagram showing an example of an appearance of the semiconductor switch module of the present embodiment.

FIG. 3 is a diagram showing an example of an appearance of a semiconductor switch module of the present embodiment. Hereinafter, an XYZ orthogonal coordinate system will be used to indicate a direction and a position as necessary. In the XYZ orthogonal coordinate system, an XY plane indicates a plane on which a semiconductor switch module is placed.

A Z axis indicates a direction from the bottom to the top of the semiconductor switch module. In the semiconductor switch module, terminals protrude from the top in the Z axis direction. A Y axis indicates a direction in which terminals of one semiconductor switch SS among the plurality of semiconductor switches SS included in the semiconductor switch module are arranged. An X axis indicates a direction in which a plurality of semiconductor switch modules are sequentially arranged.

Figure 4:
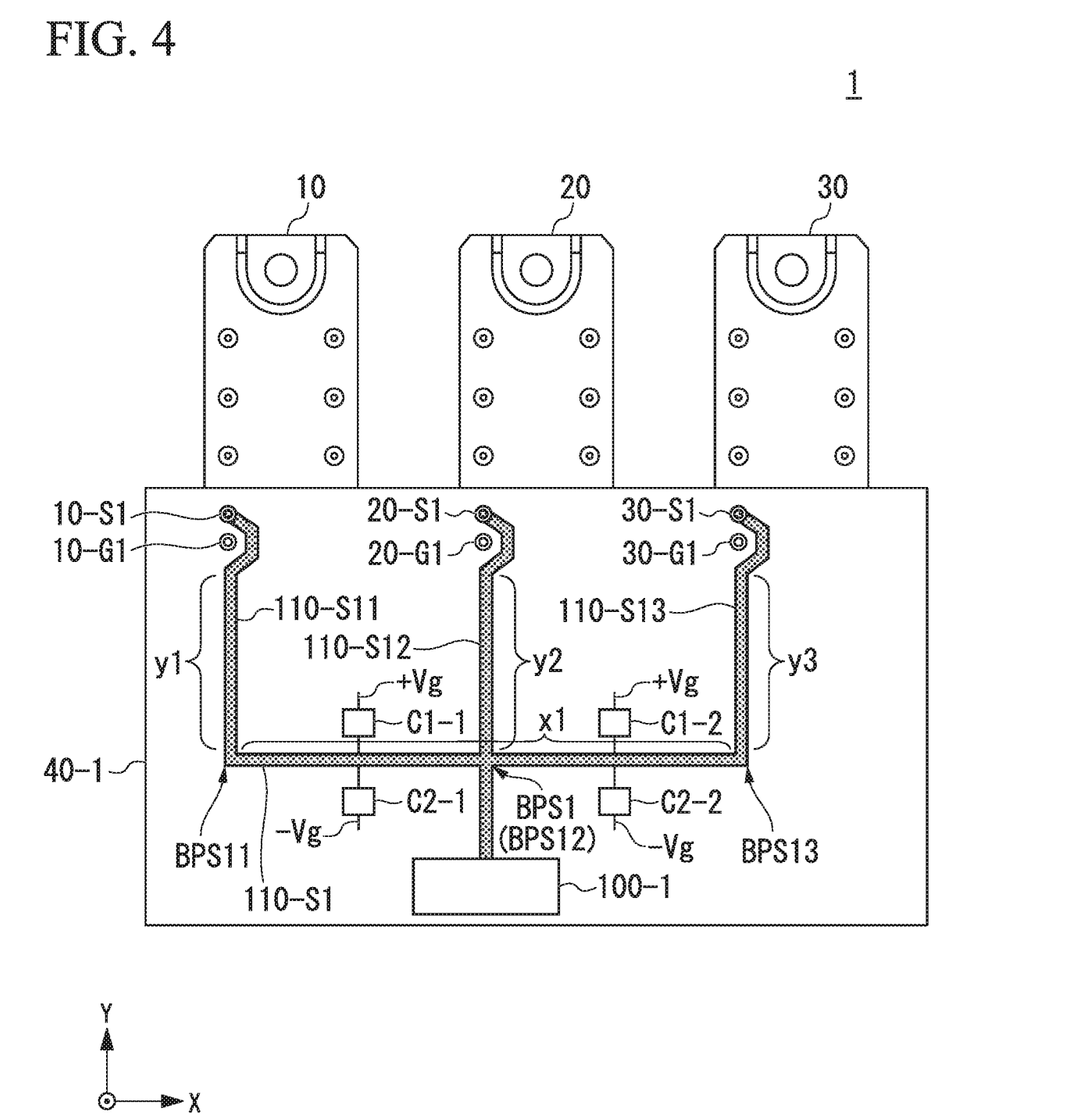
FIG. 4 is a diagram showing an example of a configuration of the power converter of the present embodiment when viewed in a Z axis direction.

The first module 10, the second module 20, and the third module 30 are sequentially disposed in the X axis direction, as in FIG. 4. The first semiconductor switch SS1 and the second semiconductor switch SS2 of the first module 10, the third semiconductor switch SS3 and the fourth semiconductor switch SS4 of the second module 20, and the fifth semiconductor switch SS5 and the sixth semiconductor switch SS6 of the third module 30 are sequentially disposed in the X axis direction in that order. That is, the semiconductor switches SS are disposed in the order of the first semiconductor switch SS1, the second semiconductor switch SS2, the third semiconductor switch SS3, the fourth semiconductor switch SS4, the fifth semiconductor switch SS5, and the sixth semiconductor switch SS6.

As shown in FIG. 3, the first module 10, the second module 20, and the third module 30 connected in parallel are disposed adjacent to each other. In addition, the same semiconductor switch module is used for the first module 10, the second module 20, and the third module 30. Therefore, a terminal arrangement of the first module 10, a terminal arrangement of the second module 20, and a terminal arrangement of the third module 30 match.

All of the terminals of the first module 10, that is, the high potential connection terminal 10-D1, the low potential connection terminal 10-S2A, the first AC output terminal 10-S1D2, the first gate connection terminal 10-G1, the second gate connection terminal 10-G2, the first auxiliary source connection terminal 10-S1, and the second auxiliary source connection terminal 10-S2, are formed as pin terminals that protrude from the top of the semiconductor switch module.

Among the terminals, the high potential connection terminal 10-D1, the low potential connection terminal 10-S2A, and the first AC output terminal 10-S1D2 are formed as a pair of pin terminals.

Next, for the semiconductor switch module, a structure of the power converter 1 in which a multilayer printed wiring board 40 and the drive circuit 100 are combined will be described with reference to FIGS. 4, 5, 6A, 6B and 6C.

FIG. 4 is a diagram showing an example of a configuration of the power converter 1 of the present embodiment when viewed in the Z axis direction.

The Z axis direction herein refers to a direction in which layers of the multilayer printed wiring board 40 are laminated. In the power converter 1, the drive circuit 100 is connected to the first module 10, the second module 20, and the third module 30 through the multilayer printed wiring board 40. In the following description, the multilayer printed wiring board 40 will be referred to simply as a multilayer substrate.

FIG. 4 shows a wiring pattern of a first layer 40-1 among a plurality of layers included in the multilayer printed wiring board 40.

In addition, FIGS. 4, 5, 6A, 6B and 6C show the first drive circuit 100-1 within the drive circuit 100 and wiring patterns from the first drive circuit 100-1 to the semiconductor switch SS. Description of the second drive circuit 100-2 is omitted and description of the wiring pattern from the second drive circuit 100-2 to the semiconductor switch SS is omitted.

As shown in FIG. 4, in the multilayer printed wiring board 40, a wiring pattern that connects the first drive circuit 100-1 to the first module 10, the second module 20 and the third module 30 is formed.

Specifically, in the first layer 40-1 of the multilayer printed wiring board 40, a wiring pattern of a reference potential wiring that connects the first drive circuit 100-1 to the first auxiliary source connection terminal 10-S1 of the first module 10, the first auxiliary source connection terminal 20-S1 of the second module 20 and the first auxiliary source connection terminal 30-S1 of the third module 30 is formed. Specifically, in the first layer 40-1, wiring patterns of the reference potential common wiring 110-S1, the reference potential first branch wiring 110-S11, the reference potential second branch wiring 110-S12, and the reference potential third branch wiring 110-S13 are formed. The reference potential common wiring 110-S1 is formed as a wiring pattern from the first drive circuit 100-1 in the first layer 40-1 to a branch point BPS11 and a branch point BPS13 through a branch point BPS1. The reference potential first branch wiring 110-S11 is formed as a wiring pattern from the branch point BPS11 to the first auxiliary source connection terminal 10-S1. The reference potential second branch wiring 110-S12 is formed as a wiring pattern from a branch point BPS12 (that is, the branch point BPS1) to the first auxiliary source connection terminal 20-S1. The reference potential third branch wiring 110-S13 is formed as a wiring pattern from the branch point BPS13 to the first auxiliary source connection terminal 30-S1.

In addition, the multilayer printed wiring board 40 has through holes into and on which terminals of the first module 10, the second module 20, and the third module 30 are inserted and mounted. When the multilayer printed wiring board 40 has the through holes, it is possible to further reduce a wiring length between the drive circuit 100 and the semiconductor switch SS than when terminals are connected by, for example, an electrical wire.

[Common Wiring and Branch Wiring]

In the example shown in FIG. 4, within the wiring pattern of the reference potential common wiring 110-S1, a wiring pattern from the branch point BPS11 to the branch point BPS13 will be referred to simply as a common wiring. That is, the common wiring is a wiring pattern which extends in a direction in which the semiconductor switch modules are arranged, that is, in the X axis direction, within the wiring pattern from the drive circuit to the semiconductor switch module.

In addition, in this example, the wiring pattern of the reference potential first branch wiring 110-S11, the wiring pattern of the reference potential second branch wiring 110-S12, and the wiring pattern of the reference potential third branch wiring 110-S13 will be referred to simply as a branch wiring. That is, the branch wiring is a wiring pattern which extends in a direction from the common wiring to the semiconductor switch module, that is, in the Y axis direction, within the wiring pattern from the drive circuit to the semiconductor switch module.

The above-described branch point BP is a position at which one wiring pattern is divided into a plurality of wiring patterns among positions on the wiring pattern or a position at which division occurs from the wiring pattern of the common wiring among positions on the wiring pattern. For example, the branch point BPS1 shown in FIG. 4 is an example of a position at which one wiring pattern is divided into a plurality of wiring patterns among positions on the wiring pattern of the control signal wiring. In addition, the branch point BPS11, the branch point BPS12, and the branch point BPS13 shown in FIG. 4 are examples of positions at which a wiring pattern is divided from the wiring pattern of the common wiring among positions on the wiring pattern of the control signal wiring.

That is, the wiring pattern formed on the multilayer printed wiring board 40 includes the common wiring and the branch wiring. The common wiring is a wiring pattern from the drive circuit 100 to the branch point BP. The branch wiring is a wiring pattern branched from the common wiring at the branch point BP and is a wiring pattern from the branch point BP to terminals of the semiconductor switch SS.

[Impedance of Common Wiring]

As shown in FIG. 4, a power supply smoothing capacitor C is disposed in the common wiring, that is, a wiring pattern from the branch point BPS11 to the branch point BPS13 within the wiring pattern of the reference potential common wiring 110-S1. In this example, a power supply smoothing capacitor C1-1, a power supply smoothing capacitor C1-2, a power supply smoothing capacitor C2-1, and a power supply smoothing capacitor C2-2 are disposed in the common wiring.

The power supply smoothing capacitor C1-1 and the power supply smoothing capacitor C1-2 are connected between the common wiring and a forward bias power supply +Vg. The power supply smoothing capacitor C2-1 and the power supply smoothing capacitor C2-2 are connected between the common wiring and a reverse bias power supply −Vg.

A power supply wiring for supplying a control potential in a state of the semiconductor switch SS is disposed in the multilayer printed wiring board 40. The forward bias power supply +Vg and the reverse bias power supply −Vg form a power supply wiring for supplying a control potential in a state of the semiconductor switch SS.

In a common wiring portion of the multilayer printed wiring board 40, a capacitive element is disposed between the reference potential wiring and the power supply wiring. The above-described power supply smoothing capacitor C is an example of the capacitive element.

The capacitive element may be disposed not only between the reference potential wiring and the power supply wiring but also between the control signal wiring and the power supply wiring.

In addition, in the common wiring portion of the multilayer printed wiring board 40, a component for reducing an impedance with respect to power supply of the wiring may be provided in place of the capacitive element or in addition to the capacitive element. For example, the common wiring portion of the multilayer printed wiring board 40 may have a thicker wiring pattern and a wider wiring pattern than the branch wiring portion.

Figure 5:
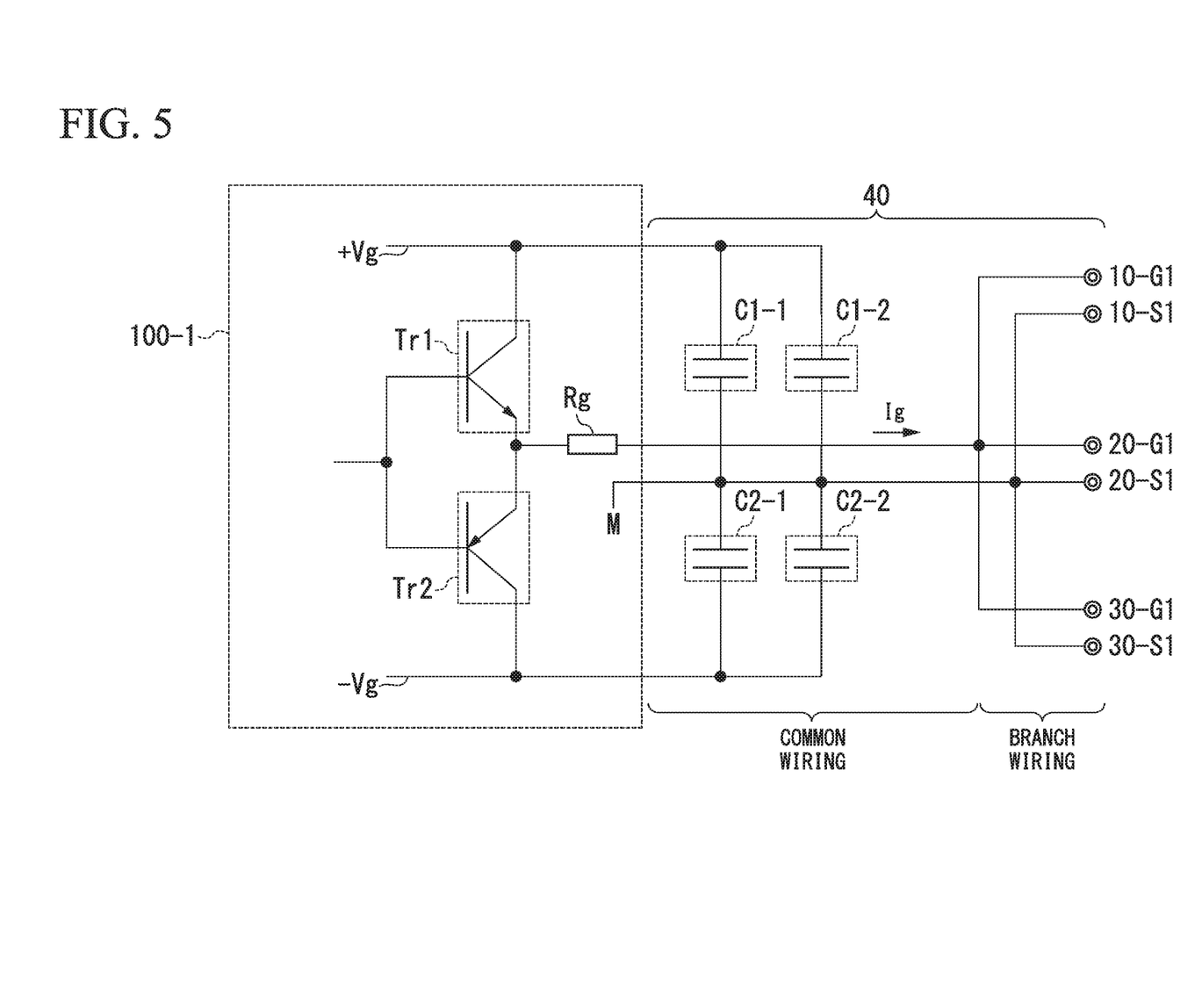
FIG. 5 is a diagram showing an example of a circuit configuration of a multilayer printed wiring board of the present embodiment.

FIG. 5 is a diagram showing an example of a circuit configuration of the multilayer printed wiring board 40 of the present embodiment. In the present embodiment, a wiring pattern from the first drive circuit 100-1 to the semiconductor switch module will be described. Since a wiring pattern from the second drive circuit 100-2 to the semiconductor switch module is the same as that of the first drive circuit 100-1, description thereof will be omitted.

The first drive circuit 100-1 includes a transistor Tr1, a transistor Tr2, and a gate resistance Rg. The transistor Tr1 controls the semiconductor switch SS which is connected to be in an on state. The transistor Tr1 is connected to the forward bias power supply +Vg and controls the semiconductor switch SS to be in an on state. The transistor Tr2 is connected to the reverse bias power supply −Vg and controls the semiconductor switch SS to be in an off state. The gate resistance Rg limits a current value of a gate drive current Ig of the semiconductor switch SS to an appropriate value.

The power supply smoothing capacitor C1-1 and the power supply smoothing capacitor C1-2 are connected to a common wiring portion of the wiring pattern of the multilayer printed wiring board 40 between the forward bias power supply +Vg and a reference potential M.

The power supply smoothing capacitor C2-1 and the power supply smoothing capacitor C2-2 are connected to a common wiring portion of the wiring pattern of the multilayer printed wiring board 40 between the reference potential M and the reverse bias power supply −Vg.

An impedance of the common wiring is reduced by the power supply smoothing capacitor C more than an impedance of the branch wiring. That is, the impedance of the common wiring is lower than the impedance of the branch wiring.

[Wiring Length of Branch Wiring]

Returning to FIG. 4, in the example shown in FIG. 4, within the wiring pattern of the reference potential common wiring 110-S1, a wiring length L of a wiring pattern from the branch point BPS11 to the branch point BPS13, that is, the wiring length L of the common wiring, is a length x1.

In addition, in this example, the wiring length L of the wiring pattern of the reference potential first branch wiring 110-S11 is a length y1. The wiring length L of the wiring pattern of the reference potential second branch wiring 110-S12 is a length y2. The wiring length L of the wiring pattern of the reference potential third branch wiring 110-S13 is a length y3. In this example, the length y1, the length y2, and the length y3 are the same.

That is, in the multilayer printed wiring board 40, the wiring lengths L of the wiring pattern of the branch wiring are the same.

When the power converter 1 includes three or more semiconductor switch modules, the wiring length L between the drive circuit 100 and the semiconductor switch SS may be different for each semiconductor switch SS. Specifically, in an example of the present embodiment, as the wiring length L, the wiring length L1 between the drive circuit 100 and the first semiconductor switch SS1 and the wiring length L2 between the drive circuit 100 and the second semiconductor switch SS2 are different from each other. In addition, as the wiring length L, the wiring length L2 between the drive circuit 100 and the second semiconductor switch SS2 and the wiring length L3 between the drive circuit 100 and the third semiconductor switch SS3 are different from each other.

When the wiring length L between the drive circuit 100 and the semiconductor switch SS is different for each semiconductor switch SS, a difference occurs in the wiring impedance. Accordingly, a transient imbalance occurs between the gate drive currents Ig of the semiconductor switches SS. When the wiring length L between the drive circuit 100 and the semiconductor switch SS is the same for each semiconductor switch SS, that is, when the wirings have the same length, an imbalance between the gate drive currents Ig can be reduced.

In the multilayer printed wiring board 40 of the present embodiment, an impedance of the common wiring portion is lower than an impedance of the branch wiring portion. Therefore, for impedance characteristics of the wiring pattern of the multilayer printed wiring board 40, characteristics of the branch wiring portion are more dominant than characteristics of the common wiring portion. In addition, in the multilayer printed wiring board 40, the wiring length L of the branch wiring portion is equal among a plurality of branch wirings. That is, in the multilayer printed wiring board 40, the branch wiring portions have wirings with the same length. That is, in the multilayer printed wiring board 40 of the present embodiment, the branch wiring portions whose impedance characteristics of the wiring pattern are dominant have wirings with the same length.

Therefore, according to the multilayer printed wiring board 40 of the present embodiment, even if the wiring length L between the drive circuit 100 and the semiconductor switch SS is different for each semiconductor switch SS, the effect of wirings with the same length is obtained and an imbalance between the gate drive currents Ig can be reduced.

That is, according to the power converter 1 of the present embodiment, it is possible to reduce a transient current imbalance occurring when the plurality of semiconductor switches SS are connected in parallel. That is, according to the power converter 1 of the present embodiment, it is possible to reduce malfunctions of the semiconductor switch due to the transient current imbalance.

[Disposition of Wiring Pattern in Lamination Direction]

Figure 6A:
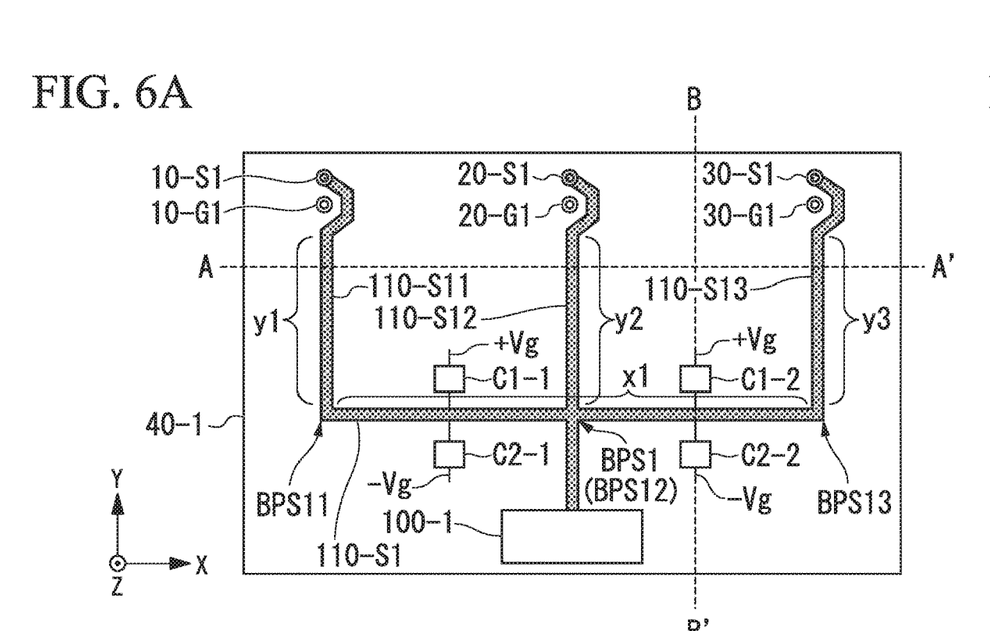
FIG. 6A is a diagram showing the example of wiring patterns of layers of the multilayer printed wiring board of the present embodiment viewed in an X axis direction which shows one layer of the board.
Figure 6B:
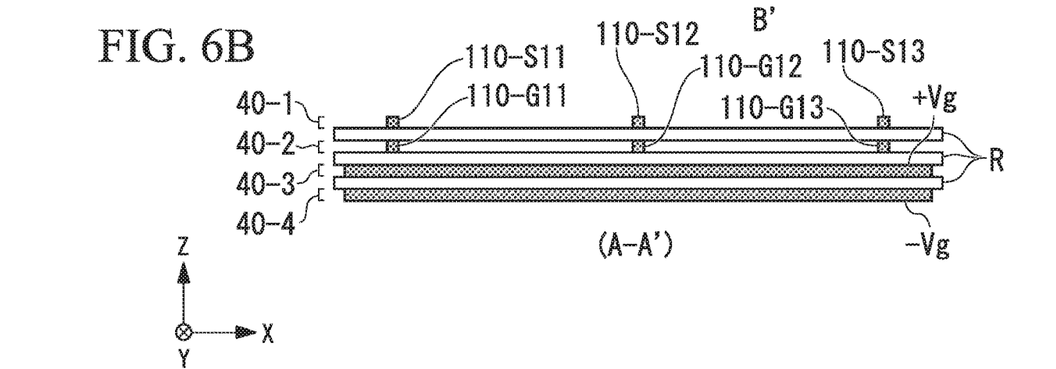
FIG. 6B is a diagram showing the example of wiring patterns of layers of the multilayer printed wiring board of the present embodiment viewed in a Y axis direction.
Figure 6C:
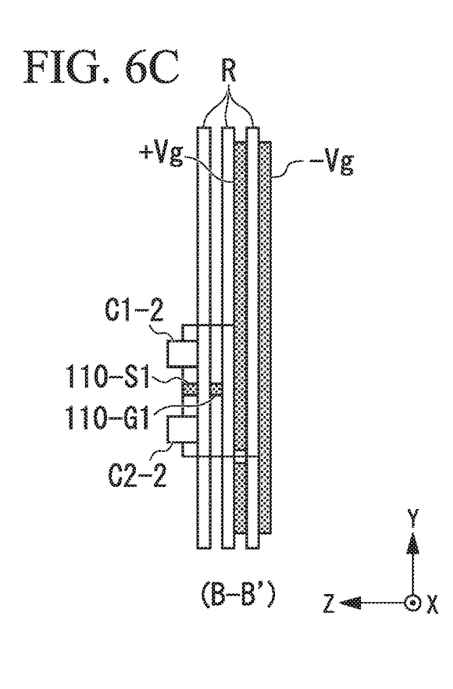
FIG. 6C is a diagram showing the example of wiring patterns of layers of the multilayer printed wiring board of the present embodiment viewed in an Z axis direction.

FIGS. 6A, 6B and 6C are diagrams showing an example of wiring patterns of layers of the multilayer printed wiring board 40 of the present embodiment. As shown in FIGS. 6A and 6B, a wiring pattern of the reference potential wiring is disposed in the first layer 40-1. Specifically, the reference potential common wiring 110-S1, the reference potential first branch wiring 110-S11, the reference potential second branch wiring 110-S12, and the reference potential third branch wiring 110-S13 are disposed in the first layer 40-1.

In addition, in FIGS. 6B and 6C, a wiring pattern of a control signal wiring (a gate signal wiring) is disposed in a second layer 40-2. Specifically, the control signal common wiring 110-G1, the control signal first branch wiring 110-G11, the control signal second branch wiring 110-G12, and the control signal third branch wiring 110-G13 are disposed in the second layer 40-2.

In FIGS. 6B and 6C, a power supply plane of the forward bias power supply +Vg is disposed in a third layer 40-3. In FIGS. 6B and 6C, a power supply plane of the reverse bias power supply −Vg is disposed in a fourth layer 40-4.

A wiring pattern of the first layer 40-1 and a wiring pattern of the second layer 40-2 are disposed at positions overlapping in a lamination direction AZ of the multilayer printed wiring board 40. The lamination direction AZ of the multilayer printed wiring board 40 is a direction in which layers of the multilayer printed wiring board 40 are laminated, that is, the Z axis direction in FIGS. 6A, 6B and 6C.

Specifically, the reference potential common wiring 110-S1 of the first layer 40-1 and the control signal common wiring 110-G1 of the second layer 40-2 are disposed at positions overlapping in the lamination direction AZ of the multilayer printed wiring board 40. The reference potential first branch wiring 110-S11 of the first layer 40-1 and the control signal first branch wiring 110-G11 of the second layer 40-2 are disposed at positions overlapping in the lamination direction AZ of the multilayer printed wiring board 40. The reference potential second branch wiring 110-S12 and the control signal second branch wiring 110-G12, and the reference potential third branch wiring 110-S13 and the control signal third branch wiring 110-G13 are disposed at positions overlapping in the lamination direction AZ of the multilayer printed wiring board 40.

That is, in the multilayer printed wiring board 40, the reference potential wiring and the control signal wiring are disposed in different layers at positions overlapping in the lamination direction AZ of the multilayer printed wiring board 40.

That is, the multilayer printed wiring board 40 has a so-called laminate structure in which a control signal wiring and a reference potential wiring of one semiconductor switch SS are disposed with an insulating layer R interposed therebetween.

Specifically, as shown in FIG. 6(B) and FIG. 6(C), the multilayer printed wiring board 40 has a laminate structure in which the control signal first branch wiring 110-G11 and the reference potential first branch wiring 110-S11 are disposed with the insulating layer R interposed therebetween. In addition, the multilayer printed wiring board 40 has a laminate structure in which the control signal first branch wiring 110-G21 and the reference potential first branch wiring 110-S21 are disposed with the insulating layer R interposed therebetween. In addition, the multilayer printed wiring board 40 has a laminate structure in which the control signal third branch wiring 110-G23 and the reference potential third branch wiring 110-S23 are disposed with the insulating layer R interposed therebetween.

As the thickness of the insulating layer R in the Z axis direction, a thickness at which it is possible to ensure isolation of a current that flows in the wiring patterns is selected.

In the control signal wiring, the gate drive current Ig flows in the direction from the drive circuit 100 toward the semiconductor switch SS. In addition, in the reference potential wiring, a current having the same current value as the above-described gate drive current Ig flows in the direction from the semiconductor switch SS toward the drive circuit 100. That is, in the control signal wiring and the reference potential wiring, currents having the same current value flow in opposite directions, that is, reciprocating currents flow. Therefore, when the multilayer printed wiring board 40 has a laminate structure, a magnetic flux generated by a current that flows in one wiring and a magnetic flux generated by a current that flows in the other wiring are cancelled out. Therefore, when the multilayer printed wiring board 40 has a laminate structure, it is possible to reduce a wiring inductance of the control signal wiring and the reference potential wiring.

In addition, in the multilayer printed wiring board 40, the shape of the wiring pattern of the reference potential wiring and the shape of the wiring pattern of the control signal wiring match when viewed in the lamination direction AZ. That is, in the reference potential wiring and the control signal wiring connected to one semiconductor switch SS, the shapes of the wiring patterns of these wirings are the same. When it is described that the shapes of wiring patterns match, this indicates not only a case in which the shapes are completely identical to each other but also a case in which wiring widths W of wiring patterns are different and a case in which wirings are disposed with a shift in the X axis direction or the Y axis direction when viewed in the lamination direction AZ of the multilayer printed wiring board 40.

According to the above-described configuration, the power converter 1 can further enhance the effect of cancelling out magnetic fluxes between wirings than when the shapes of the wiring patterns do not match.

In other words, in the multilayer printed wiring board 40, in portions in which the reference potential wiring and the control signal wiring overlap in the lamination direction AZ, wirings are disposed so that the wiring shape of the reference potential wiring and the wiring shape of the control signal wiring match when viewed in the lamination direction of the multilayer printed wiring board 40.

That is, in the reference potential wiring and the control signal wiring connected to one semiconductor switch SS, the shapes of the wiring patterns of these wirings are the same. When it is described that the shapes of wiring patterns are the same, this indicates not only a case in which the shapes are completely identical to each other but also a case in which wiring widths W of wiring patterns are different and a case in which wirings are disposed with a shift in the X axis direction or the Y axis direction when viewed in the lamination direction of the multilayer printed wiring board 40.

In the power converter 1 of the present embodiment, the multilayer printed wiring board 40 has a laminate structure. Therefore, according to the power converter 1 of the present embodiment, it is possible to reduce a wiring inductance of the control signal wiring and the reference potential wiring. That is, according to the power converter 1 of the present embodiment, it is possible to reduce malfunctions of the semiconductor switch due to noise caused by a wiring inductance of the printed wiring board.

In addition, in the power converter 1 of the present embodiment, the multilayer printed wiring board 40 is connected to a terminal of the semiconductor switch module via a through hole. Therefore, according to the power converter 1 of the present embodiment, the wiring length between the drive circuit 100 and the semiconductor switch module can be shorter than when the multilayer printed wiring board 40 is not connected via a through hole. That is, according to the power converter 1 of the present embodiment, it is possible to reduce vibration and inductive noise of a gate signal generated when the wiring length between the drive circuit 100 and the semiconductor switch module is long. That is, according to the power converter 1 of the present embodiment, it is possible reduce malfunctions of the semiconductor switch due to vibration and inductive noise of a gate signal.

In addition, in the power converter 1 of the present embodiment, an impedance of the common wiring is reduced so that the wiring pattern of the multilayer printed wiring board 40 has the effect of wirings with the same length. Therefore, according to the power converter 1 of the present embodiment, it is possible to reduce a transient current imbalance occurring when the plurality of semiconductor switches SS are connected in parallel. That is, according to the power converter 1 of the present embodiment, it is possible to reduce malfunctions of the semiconductor switch due to the transient current imbalance.

[Modification]

A modification of the power converter 1 of the present embodiment will be described with reference to FIGS. 7A, 7B and 7C.

Figure 7A:
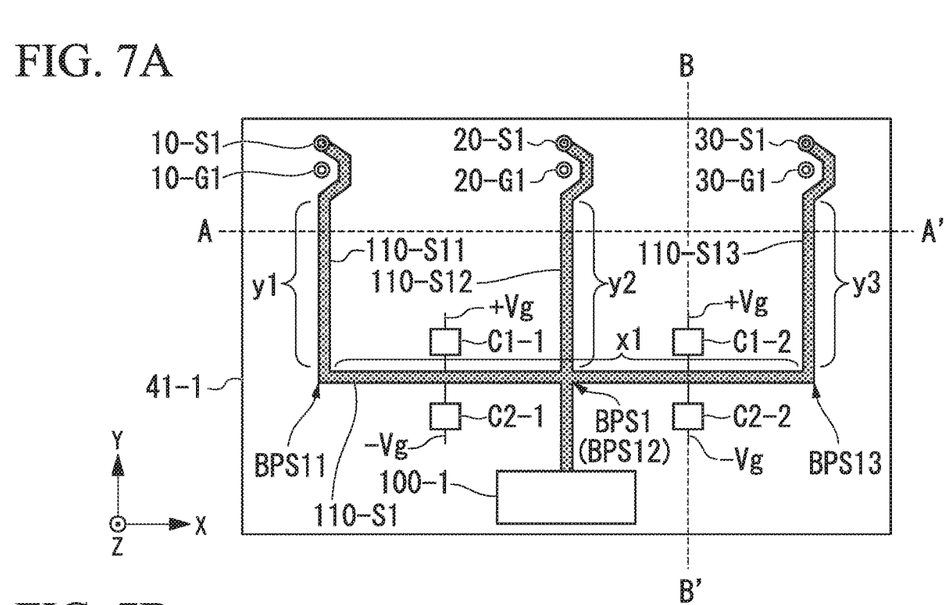
FIG. 7A is a diagram showing a modification of the power converter of the present embodiment along an x-axis direction which shows one layer thereof.
Figure 7B:
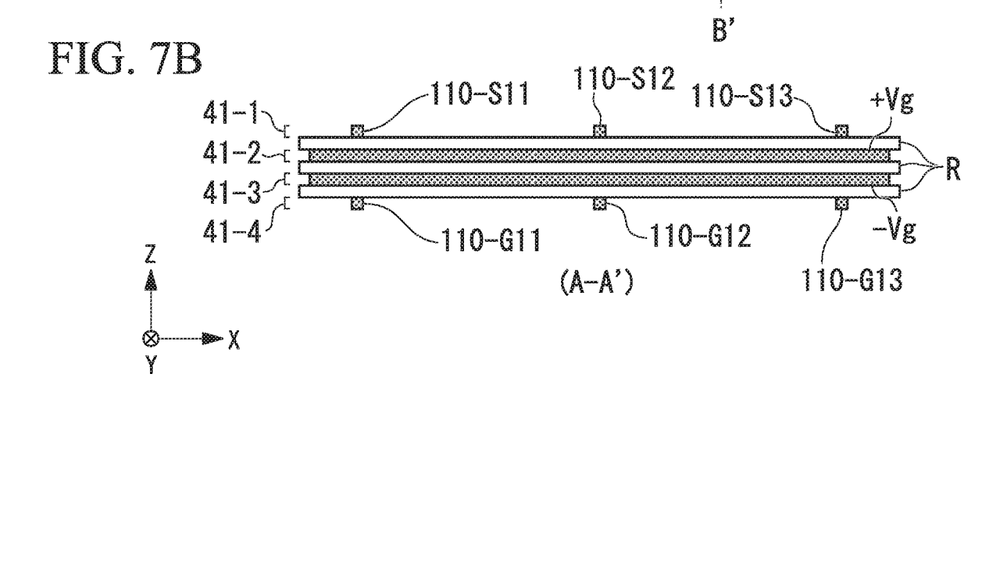
FIG. 7B is a diagram showing the power converter embodiment in a Y axis direction.
Figure 7C:
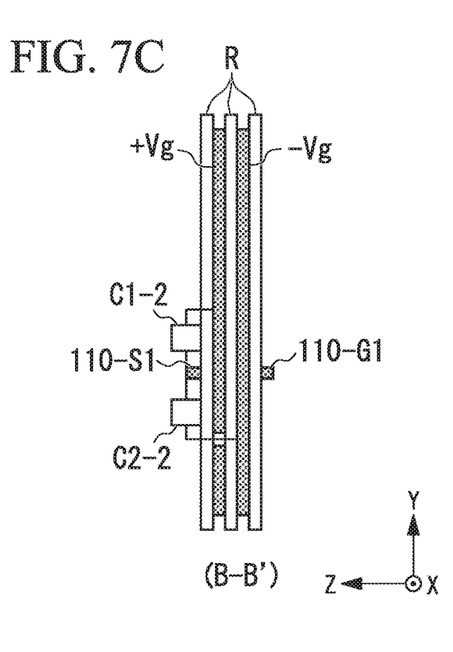
FIG. 7C is a diagram showing the power converter embodiment in a Z axis direction.

FIGS. 7A, 7B and 7C are diagrams showing a modification of the power converter 1 of the present embodiment. In this modification, the power converter 1 includes a multilayer printed wiring board 41 in place of the above-described multilayer printed wiring board 40. In the multilayer printed wiring board 40, the power supply plane is disposed in the third layer 40-3 and the fourth layer 40-4. However, the multilayer printed wiring board 41 is different from the above-described multilayer printed wiring board 40 in that the power supply plane is disposed in a second layer 41-2 and a third layer 41-3.

According to such a configuration of the present modification, the power converter 1 can reduce a wiring inductance of the control signal wiring and the reference potential wiring. Therefore, according to the power converter 1 of the present modification, it is possible to reduce malfunctions of the semiconductor switch due to noise caused by a wiring inductance of the printed wiring board.

Second Embodiment

A power converter of a second embodiment will be described with reference to FIG. 8 and FIGS. 9A, 9B and 9C. The same components as in the first embodiment are denoted with the same reference numerals and descriptions thereof will be omitted.

Figure 8:
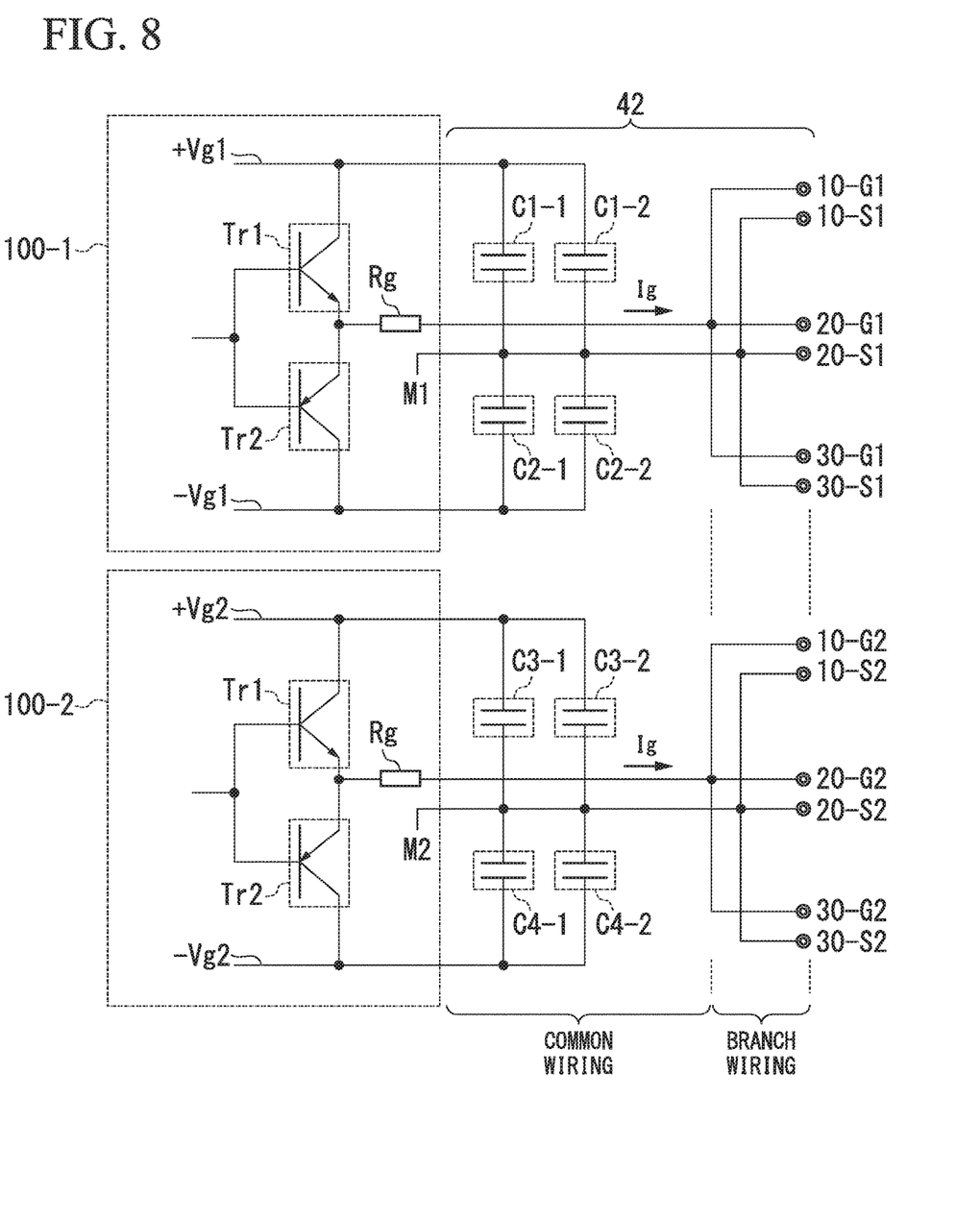
FIG. 8 is a diagram showing an example of a circuit configuration of a multilayer printed wiring board of a power converter of a second embodiment.

FIG. 8 is a diagram showing an example of a circuit configuration of a multilayer printed wiring board 42 of the present embodiment. In the present embodiment, a wiring pattern from the first drive circuit 100-1 to the semiconductor switch module and a wiring pattern from the second drive circuit 100-2 to the semiconductor switch module will be described.

Similarly to the above-described first drive circuit 100-1, the second drive circuit 100-2 includes the transistor Tr1, the transistor Tr2, and the gate resistance Rg.

The transistor Tr1 of the first drive circuit 100-1 is connected to a forward bias power supply +Vg1. The transistor Tr2 of the first drive circuit 100-1 is connected to a reverse bias power supply −Vg1.

The transistor Tr1 of the second drive circuit 100-2 is connected to a forward bias power supply +Vg2. The transistor Tr2 of the second drive circuit 100-2 is connected to a reverse bias power supply −Vg2.

A potential of the forward bias power supply +Vg1 and a potential of the forward bias power supply +Vg2 are different from each other. That is, the forward bias power supply +Vg1 and the forward bias power supply +Vg2 are power supplies whose potentials are different from each other.

In addition, a potential of the reverse bias power supply −Vg1 and a potential of the reverse bias power supply −Vg2 are different from each other. That is, the reverse bias power supply −Vg1 and the reverse bias power supply −Vg2 are power supplies whose potentials are different from each other.

In addition, a reference potential M1 of the first drive circuit 100-1 and a reference potential M2 of the second drive circuit 100-2 are different. Therefore, the semiconductor switch SS driven by the first drive circuit 100-1 and the semiconductor switch SS driven by the second drive circuit 100-2 are different in reference potential.

Figures 9A, 9B, 9C:
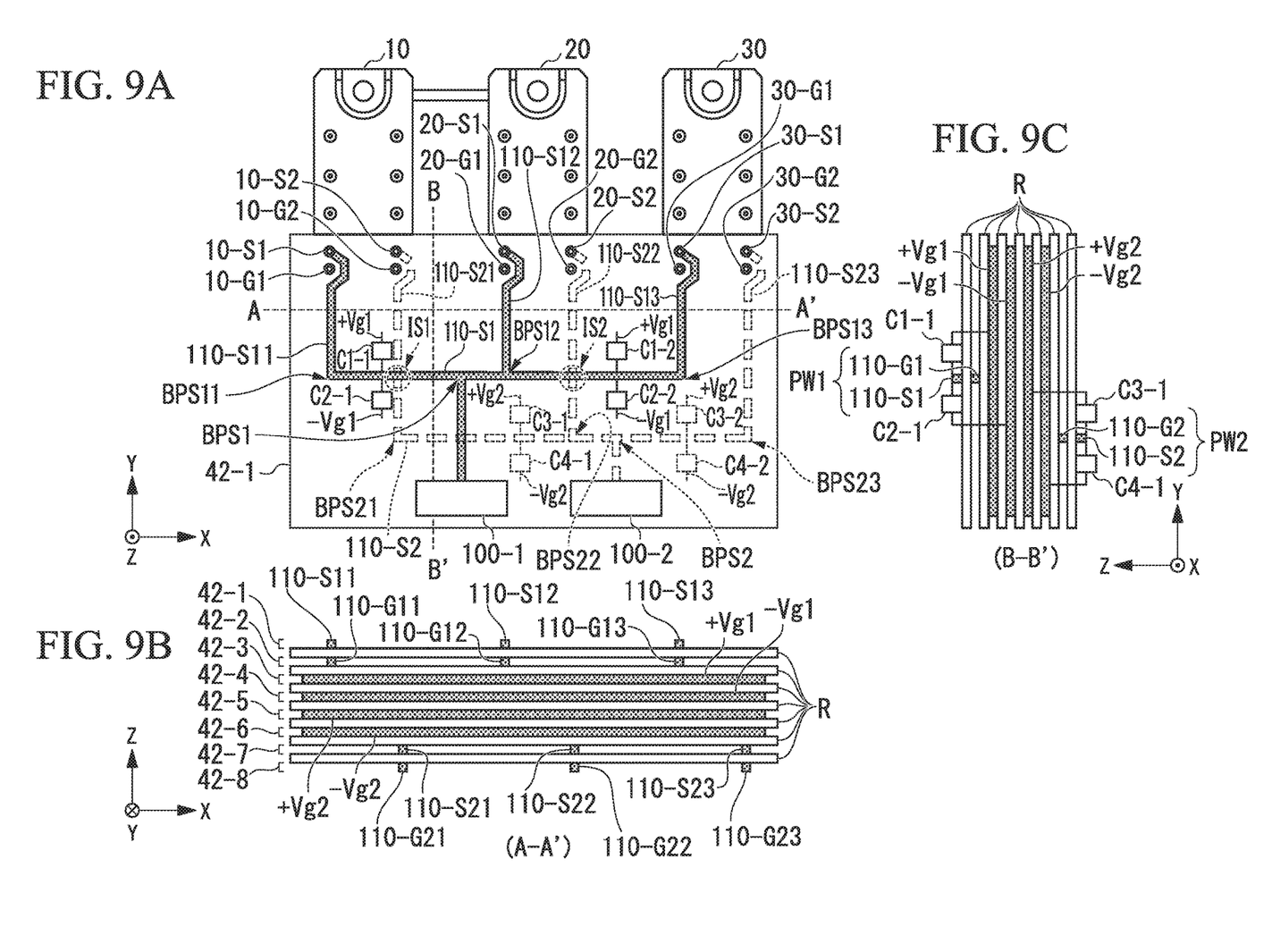
FIG. 9A is a diagram showing an example of a wiring pattern of layers of the multilayer printed wiring board of the present embodiment in an X axis direction.
FIG. 9B is a diagram showing an example of the wiring pattern of layers of the multilayer printed wiring board of the present embodiment in a Y axis direction.
FIG. 9C is a diagram showing an example of the wiring pattern of layers of the multilayer printed wiring board of the present embodiment in a Z axis direction.

FIGS. 9A, 9B and 9C are diagrams showing an example of a wiring pattern of layers of the multilayer printed wiring board 42 of the present embodiment. As shown in FIGS. 9A, 9B and 9C, a wiring pattern connected to the first drive circuit 100-1, that is, a wiring pattern of the reference potential M1, is disposed in a first layer 42-1 to a fourth layer 42-4.

Specifically, the reference potential common wiring 110-S1, the reference potential first branch wiring 110-S11, the reference potential second branch wiring 110-S12, and the reference potential third branch wiring 110-S13 are disposed in the first layer 42-1.

The control signal common wiring 110-G1, the control signal first branch wiring 110-G11, the control signal second branch wiring 110-G12 and the control signal third branch wiring 110-G13 are disposed in the second layer 42-2.

A power supply plane of the forward bias power supply +Vg1 is disposed in the third layer 42-3.

A power supply plane of the reverse bias power supply −Vg1 is disposed in the fourth layer 42-4.

A wiring pattern connected to the second drive circuit 100-2, that is, a wiring pattern of the reference potential M2, is disposed in a fifth layer 42-5 to an eighth layer 42-8.

Specifically, a power supply plane of the forward bias power supply +Vg2 is disposed in the fifth layer 42-5.

A power supply plane of the reverse bias power supply −Vg2 is disposed in the sixth layer 42-6.

The reference potential common wiring 110-S2, the reference potential first branch wiring 110-S21, the reference potential second branch wiring 110-S22, and the reference potential third branch wiring 110-S23 are disposed in the seventh layer 42-7.

The control signal common wiring 110-G2, the control signal first branch wiring 110-G21, the control signal second branch wiring 110-G22, and the control signal third branch wiring 110-G23 are disposed in the eighth layer 42-8.

[Intersection of Wiring Patterns]

As shown in FIGS. 9A, 9B and 9C, a wiring pattern of the first layer 42-1 and a wiring pattern of the second layer 42-2, and a wiring pattern of the seventh layer 42-7 and a wiring pattern of the eighth layer 42-8 are disposed such that their positions do not overlap in the lamination direction AZ of the multilayer printed wiring board 42.

At an intersection IS (an intersection IS1 and an intersection IS2) shown in FIG. 9A, the wiring pattern of the first layer 42-1 and the wiring pattern of the second layer 42-2, and the wiring pattern of the seventh layer 42-7 and the wiring pattern of the eighth layer 42-8 intersect the lamination direction AZ of the multilayer printed wiring board 42. In the following description, the wiring pattern of the first layer 42-1 and the wiring pattern of the second layer 42-2 will be referred to as a first wiring PW1, and the wiring pattern of the seventh layer 42-7 and the wiring pattern of the eighth layer 42-8 will be referred to as a second wiring PW2.

A wiring pattern of the multilayer printed wiring board 41 is disposed so that, at the intersection IS, the wiring length L at which wiring patterns, that is, the first wiring PW1 and the second wiring PW2, intersect becomes as short as possible.

For example, the intersecting wiring length L is shorter than the wiring length L of a portion in which a reference potential wiring of the first layer 42-1 and a control signal wiring of the second layer 42-2 overlap in the lamination direction AZ. In addition, the intersecting wiring length L is shorter than the wiring length L of a portion in which a reference potential wiring of the seventh layer 42-7 and a control signal wiring of the eighth layer 42-8 overlap in the lamination direction AZ.

As shown in FIG. 9A, when the wiring pattern is disposed so that the first wiring PW1 and the second wiring PW2 are orthogonal to each other at the intersection IS, the intersecting wiring length L is shorter than when the first wiring PW1 and the second wiring PW2 are not orthogonal to each other. Also, when it is described that they are orthogonal to each other, this indicates not only a case in which an angle between wiring patterns is 90° but also a case in which an angle other than 90°, for example, 80°, is formed.

When the first wiring PW1 and the second wiring PW2 are orthogonal to each other at the intersection IS, the wiring length L1 at the intersection IS of the first wiring PW1 and the wiring width W2 at the intersection IS of the second wiring PW2 are the same. In addition, when the first wiring PW1 and the second wiring PW2 are orthogonal to each other at the intersection IS, the wiring length L2 at the intersection IS of the second wiring PW2 and the wiring width W1 at the intersection IS of the first wiring PW1 are the same.

That is, in a portion in which the first wiring PW1 and the second wiring PW2 overlap in the lamination direction AZ, the wiring length L of one wiring between the first wiring PW1 and the second wiring PW2 and the wiring width W of the other wiring match.

In the upper arm and the lower arm of the semiconductor switch module, operating reference potentials of the semiconductor switch SS and switching operation timings are different.

Specifically, in the first module 10, the upper arm semiconductor switch 10-1 and the lower arm semiconductor switch 10-2 have different reference potentials and switching operation timings. In addition, in the second module 20, the upper arm semiconductor switch 20-1 and the lower arm semiconductor switch 20-2 have different reference potentials and switching operation timings.

When a wiring pattern connected to the upper arm and a wiring pattern connected to the lower arm are disposed close to each other in the multilayer printed wiring board 42, a parasitic capacitance between wirings is greater than when they are disposed apart from each other. Therefore, when a wiring pattern connected to the upper arm and a wiring pattern connected to the lower arm are disposed close to each other, noise caused by charge and discharge currents of a parasitic capacitance generated by potential variation resulting from switching of the semiconductor switch SS increases. An increase in noise adversely influences operation stability of the semiconductor switch SS.

In the multilayer printed wiring board 42 of the power converter 1 of the present embodiment, a wiring pattern connected to the upper arm and a wiring pattern connected to the lower arm are disposed at positions that do not overlap in the lamination direction AZ. That is, in the power converter 1 of the present embodiment, a wiring pattern connected to the upper arm and a wiring pattern connected to the lower arm are disposed apart from each other in the multilayer printed wiring board 41.

Therefore, according to the power converter 1 of the present embodiment, an increase in parasitic capacitance between upper and lower arm wirings is minimized and noise caused by charge and discharge currents of a parasitic capacitance can be reduced. That is, according to the power converter 1 of the present embodiment, it is possible to reduce malfunctions of the semiconductor switch due to noise caused by the wiring pattern of the printed wiring board.

While the power converter 1 in which three semiconductor switch modules are arranged in parallel has been described above, the present invention is not limited thereto. For example, the power converter 1 may include four or more semiconductor switch modules in parallel.

In addition, while the power converter 1 has been described above as a single phase 2-level inverter (DC to AC converter), the present invention is not limited thereto. For example, the power converter 1 may be a multiphase inverter or a 3-level inverter.

The embodiments and modifications of the present invention have been described above. However, these embodiments and modifications are only examples and are not intended to limit the scope of the invention. These embodiments and modifications can be implemented in various other forms and various omissions, substitutions, and changes can be made without departing from the spirit of the invention. These embodiments and modifications are included in the scope and spirit of the invention and are included in the invention described in the claims and equivalent thereof. In addition, the above-described embodiments and modifications can be appropriately combined.

What is claimed is:

1. A power converter in which a plurality of semiconductor switches are connected to a drive circuit configured to control states of the plurality of semiconductor switches, the power converter comprising:
   the plurality of semiconductor switches comprises:
   a first plurality of semiconductor switches, and a second plurality of semiconductor switches whose reference potential are different from a reference potential of the first plurality of semiconductor switches;
   wherein the drive circuit comprises:
   a first drive circuit configured to control states of the first plurality of semiconductor switches, and a second drive circuit configured to control states of the second plurality of semiconductor switches,
   wherein the multilayer substrate comprises:
   a reference potential wiring and a control signal wiring of a first wiring that connects the first drive circuit and the first plurality of semiconductor switches are disposed in different layers at positions overlapping in a substrate lamination direction, a reference potential wiring and a control signal wiring of a second wiring that connects the second drive circuit and the second plurality of semiconductor switches are disposed in different layers at positions overlapping in a substrate lamination direction, and
   wherein a wiring length of a portion in which the first wiring and the second wiring overlap in the lamination direction is shorter than a wiring length of a portion in which the reference potential wiring and the control signal wiring of the first wiring overlap in the lamination direction, and a wiring length of a portion in which the reference potential wiring and the control signal wiring of the second wiring overlap in the lamination direction.

2. The power converter according to claim 1, wherein, in the portion in which the first wiring and the second wiring overlap in the substrate lamination direction, a wiring length of the first wiring is the same as wiring width of the second wiring, or a wiring length of the second wiring is the same as a wiring width of the first wiring.

3. The power converter according to claim 1, wherein a power supply wiring supplying a potential for controlling a state of the plurality of semiconductor switch is disposed in the multilayer substrate, and
   wherein, in the common wiring portion, a capacitive element is provided between the reference potential wiring and the power supply wiring or between the control signal wiring and the power supply wiring.

4. The power converter according to claim 1, wherein, in a portion in which the reference potential wiring and the control signal wiring overlap in the substrate lamination direction, a wiring shape of the reference potential wiring and a wiring shape of the control signal wiring match when viewed in the lamination direction.

* * * * *